United States Patent [19]

Peterson

[11] Patent Number: 5,694,345
[45] Date of Patent: Dec. 2, 1997

[54] HARDWARE EFFICIENT INTERPOLATION FILTER

[75] Inventor: Eric Carl Peterson, Baldwinsville, N.Y.

[73] Assignee: Thomson Consumer Electronics, Indianapolis, Ind.

[21] Appl. No.: 496,779

[22] Filed: Jun. 29, 1995

[51] Int. Cl.$^6$ .............................. G06F 7/38; G06F 17/17
[52] U.S. Cl. .............................. 364/723; 364/724.1
[58] Field of Search ..................... 364/723, 724.1; 84/603, 604, 605; 382/300

[56] References Cited

U.S. PATENT DOCUMENTS

| | | | |
|---|---|---|---|
| 4,313,173 | 1/1982 | Candy et al. | 364/723 |
| 4,719,833 | 1/1988 | Katoh et al. | 84/603 |
| 5,111,727 | 5/1992 | Rossum | 84/603 |
| 5,117,725 | 6/1992 | Takauji et al. | 84/605 |
| 5,177,698 | 1/1993 | Parulski | 364/723 |

*Primary Examiner*—Chuong D. Ngo
*Attorney, Agent, or Firm*—Joseph S. Tripoli; Eric P. Herrmann; Ronald H. Kurdyla

[57] ABSTRACT

An interpolation filter includes a subtractor, a weighting circuit and an adder, wherein the subtractor is conditioned to form differences of adjacent original samples, and the weighting circuit weights the differences with a predetermined value. The adder is arranged to a) pass an original sample; b) add a weighted difference to the original sample; and c) successively add the weighted difference to the previously generated sample to form successive samples.

7 Claims, 2 Drawing Sheets

HARDWARE EFFICIENT INTERPOLATION FILTER

This invention relates to interpolation apparatus as for generating samples interstitial other samples of a sampled signal.

BACKGROUND OF THE INVENTION

There are many different interpolation filter designs currently known, but they typically are of three types. The first type is in the form of an output weighted finite impulse response FIR, filter, in which a plurality of successively delayed samples are weighted and summed to generate an interstitial sample value. The second type typically weights two adjacent original sample values in complementary fashion, and sums the weighted values to form a new sample value. For example, if two original sample values are designated S1 and S2, and it is desired to interpose three interpolated values between S1 and S2, the following functions will be performed in successive order to generate a sequence of values S1, Sa, Sb, Sc, S2, where Sa, Sb, Sc, are interstitial values formed according to the equations:

$$Sa = 0.75(S1) + (1-0.75)(S2) \quad (1)$$

$$Sb = 0.50(S1) + (1-0.50)(S2) \quad (2)$$

$$Sc = 0.25(S1) + (1-0.25)(S2) \quad (3)$$

It will be noted that in order to generate the values Sa, Sb, Sc, the apparatus must be capable of performing variable weighting; a function which can significantly complicate the interpolation apparatus.

The third type of interpolation filter typically determines the difference between adjacent original samples, weights the difference and then adds the weighted difference to the leading sample. In this instance, the algorithm performed is according to the equation:

$$Si = S1 + (S2-S1)(K) \quad (4)$$

where K is a variable scale factor. If a sample sequence S1, Sa, Sb, Sc, S2 is to be formed, the interstitial values Sa, Sb, Sc are generated according to the equations:

$$Sa = S1 + (S2-S1)(0.25) \quad (5)$$

$$Sb = S1 + (S2-S1)(0.50) \quad (6)$$

$$Sc = S1 + (S2-S1)(0.75) \quad (7)$$

This type of interpolation filter also requires a variable weighting apparatus which can significantly complicate the overall interpolation apparatus.

SUMMARY OF THE INVENTION

An interpolation filter according to the present invention includes a subtractor, a weighting circuit and an adder. The subtractor is conditioned to form differences of adjacent original samples. The weighting circuit weights the differences with a predetermined value. The adder is arranged to a) pass an original sample; b) add a weighted difference to the original sample; and c) successively add the weighted difference to the previously generated sample to form successive samples.

DETAILED DESCRIPTION

Figure 1:
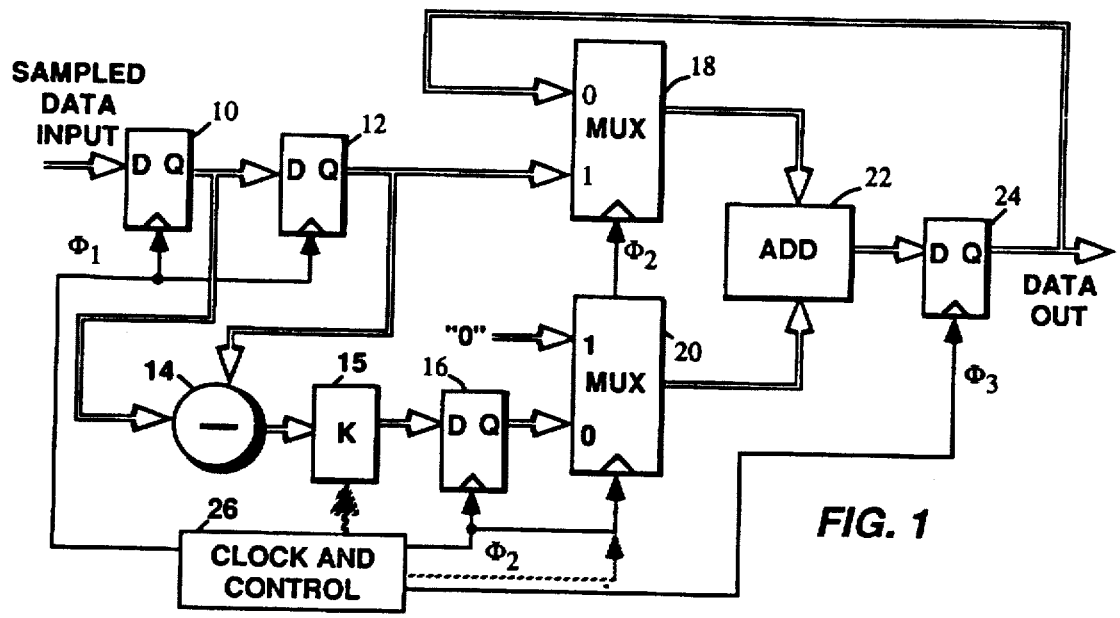
FIG. 1 is a block diagram of an interpolator embodying the invention.
Figure 2:
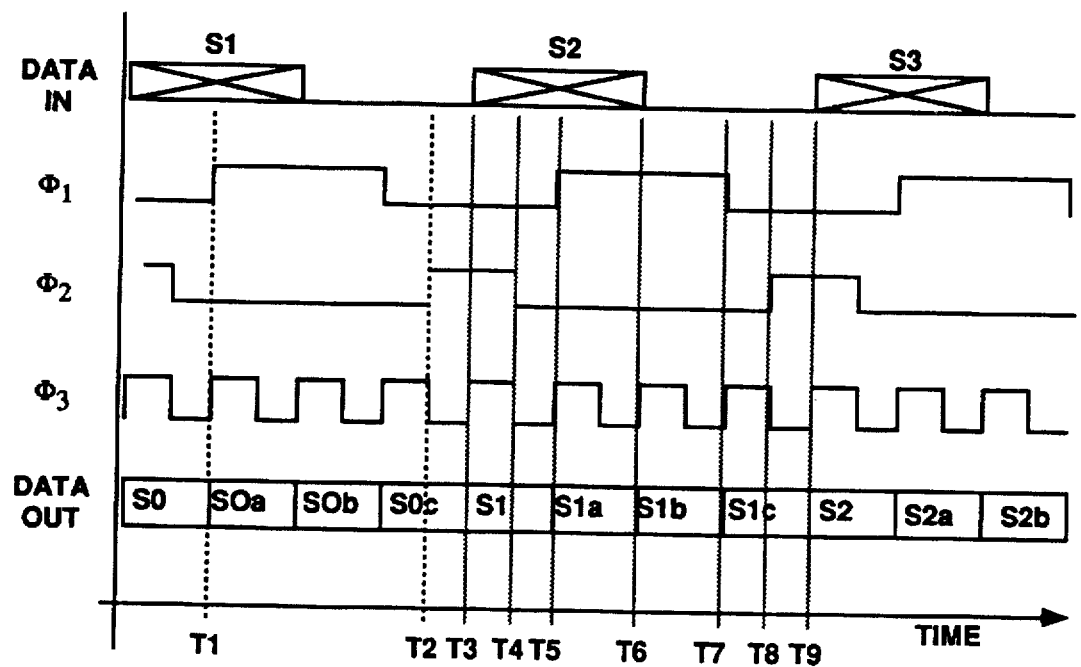
FIG. 2 illustrates clock signal waveforms applied to the FIG. 1 apparatus, which waveforms are useful in describing operation of the invention.

Referring to FIGS. 1 and 2, a sampled signal DATA IN is applied to a "D-Type" flip-flop or D-Latch 10. It is assumed that the samples occur synchronously at a predetermined rate $f_S$ defined by the clock signal $\Phi 1$. The input samples are valid over the intervals shown as boxes S1, S2 and S3.

The output of the D-Latch 10 is coupled to an input of a D-Latch 12. The output terminals of the D-Latches 10 and 12 are applied to a subtractor 14 which generates the difference of successive sample values stored in D-Latches 10 and 12. The differences are applied to a weighting circuit 15, which weights respective differences by a value K. If the weighting value is a binary fraction such as $\tfrac{1}{2}^n$, the weighting circuit may be a simple bit-shifter for shifting respective bits of the difference value to bit positions of lesser significance. Alternatively, if the scale factor is equivalent to a sum of binary fractions, the weighting circuit may be in the form of a bit-shift and add circuit. The weighting circuit may take other forms such as a memory programmed at respective address locations with values corresponding to the address value weighted by the desired weighting factor. In an alternative arrangement using memory as a weighting device, only the more significant bits of respective difference values may be used as address values applied to a preprogrammed memory. An advantage of using programmed memory as a weighting circuit is that it may be easily reprogrammed to provide different weighting factors for different applications.

The weighted differences from the weighting circuit 15 are stored in a D-Latch 16, responsive to a clock signal $\Phi 2$. Clock signal $\Phi 2$ occurs at the same rate as clock signal $\Phi 1$, and in this example, is timed such that it may be utilized to operate the further circuitry of multiplexers 18 and 20.

Sample values from the D-Latch 12 are applied to one input of the multiplexor 18, and a feedback signal from an adder 22 is applied to a second input of the multiplexor 18. The output of the multiplexer 18 is coupled to one input port of an adder 22. Sample values from the D-Latch 16 are applied to a first input port of the multiplexer 20 and a zero value is applied to a second input port of the multiplexer 20. The output port of the multiplexer 20 is coupled to a second input port of the adder 22. The output port of the adder 22 is applied to a D-Latch 24 which is clocked by a clock signal $\Phi 3$, which in the illustrated example has a rate four times the rate of clock signal $\Phi 1$. This clock arrangement permits of inserting three interpolated samples between respective original samples. The output port of the D-Latch 24 provides both an output sampled signal and the feedback signal to the multiplexer 18.

If the multiplexer 18 is conditioned to apply a sample from the D-Latch 12 to the input of the adder 22, the adder circuit operates as a simple feed forward adder. Alternatively, if the multiplexer 18 is conditioned to apply the feedback signal to the input of the adder 22, the adder circuit operates as an accumulator, successively adding, to each prior sum, values applied to the other input of the adder from the multiplexer 20.

Assume that the input sample stream consists of the samples;

S1, S2, S3, S4 . . . . . .

A representative output sample sequence may consist of;

S1, S1+KD$_{21}$, S1+2KD$_{21}$, S1+3KD$_{21}$, S2, S2+KD$_{32}$, S2+2KD$_{32}$ . . . .

where D$_{21}$ and D$_{32}$ correspond to the differences S2-S1 and S3-S2 respectively. In generating the sequence the value K remains constant. The multiples of K are realized by successively adding the difference D$_{ij}$ to the previously generated sample.

Operation of the FIG. 1 apparatus will be described for the system providing four output samples for every original input sample. In this example all D-Latches are assumed to be positive edge triggered. That is, a value present at the input of a respective D-Latch is loaded into the latch on occurrence of a positive transition of the clock signal applied to its clock input terminal. D-Latches 10 and 12 are both clocked with clock signal Φ1. Assume that at times T1, T3 and T9 samples S1, S2 and S3 are successively clocked into D-Latch 12. Concurrently samples S2, S3 and S4 are clocked into D-Latch 10. Respective samples reside in the D-Latches 10 and 12 for an entire period of the clock signal Φ1.

At times T2 and T8 valid weighted differences (S2-S1)K and (S3-S2)K are present at the output port of the weighting circuit 15, and sample values S1 and S2 respectively are present at the output port of the D-Latch 12. At time T2, the clock signal Φ2 latches the scaled difference value (S2-S1)K into D-Latch 16, which value will be valid at the output port of D-Latch 16 until time T8. Also at time T2, the clock signal Φ2 conditions the multiplexer 18 to couple sample S1 from D-Latches 12 to one input port of the adder 22, and it conditions multiplexer 20 to couple the zero value to the other input port of the adder 22. Adder 22 will output a sum equal to S1+0=S1, which is latched into D-Latch 24 at time T3.

At time T4, the clock signal Φ2 conditions multiplexer 18 to couple the feedback from D-Latch 24 to the one input of the adder 22, and conditions the multiplexer 20 to apply the value (S2-S1)K from the D-Latch 16 to the other input port of the adder 22. Adder 22 provides the sum S1a=S1+(S2-S1)K, which sum is stored in the D-Latch 24 at time T5, and output as a second sample in the sequence. At time T6 the value S1+(S2-S1)K is coupled to one input port of adder 22 by the multiplexer 18 and the value (S2-S1)K is again applied to the other input port of the adder 22 by the multiplexer 20. Adder 22 generates the sum S1b=S1+2(S2-S1)K, which is loaded in the D-Latch 24 at time T6, and output as a third value in a sequence. This sum is applied to the input of the adder by multiplexer 18, and the value (S2-S1)K from the D-Latch 16 is applied to the other input port of the adder 22 by the multiplexer 20. Adder 22 generates the sum S1c=S1+3(S2-S1)K, which is loaded into the D-Latch 24 at time T7, and output as the fourth sample in the sequence. At time T8, the clock signal Φ2 switches the multiplexers 18 and 20 to apply the value in D-Latch 12 and the "0" value respectively to the two input ports of the adder 22, starting a new sequence of four samples. The value in D-Latch 12 is now S2, having been loaded in the D-Latch 12 at time T5, and the value in D-Latch 16 is (S3-S2), loaded at time T. The adder 22 produces the sum of S2 which is stored in the D-Latch 24 at time T9 as the fifth sample in the signal sample stream. The output signal sequence is equal to S1, S1+(S2-S1)K, S1+2(S2-S1)K, S1+3(S2-S1)K, S2, S2+(S3-S2)K. . . . . . .

The value of K for the foregoing example is ¼ for linear interpolation upsampling to 4:1. In alternative systems where N samples are provided for every one original sample, the value K should equal 1/N, and in general will be constant. A generalized sequence of samples will be of the form;

S1, S1+(S2-S1)/N, S1+2(S2-S1)/N, . . . . S1+(N-1)(S2-S1)/N, S2 . . . .

The apparatus of FIG. 1 includes a variable control signal from element 26, for changing the value K. However, in this system, it is presumed that such changes will not occur between samples but rather only to reconfigure the system to change the number of interstitial samples to be produced between original samples.

It will also be appreciated by those skilled in the art, that the function of multiplexer 20 may be performed by an AND gate for coupling the weighted differences to the adder. In this instance the AND gate may be enabled to pass values with a signal that is the logical inverse of clock Φ2. In addition the control of the multiplexers may be by signal other than clock signal Φ2, for example a signal of similar frequency but slightly different timing or phase, and/or of different frequency from Φ2. This is suggested in FIG. 1 by the phantom arrow between element 26 and multiplexer 20.

Figure 3:
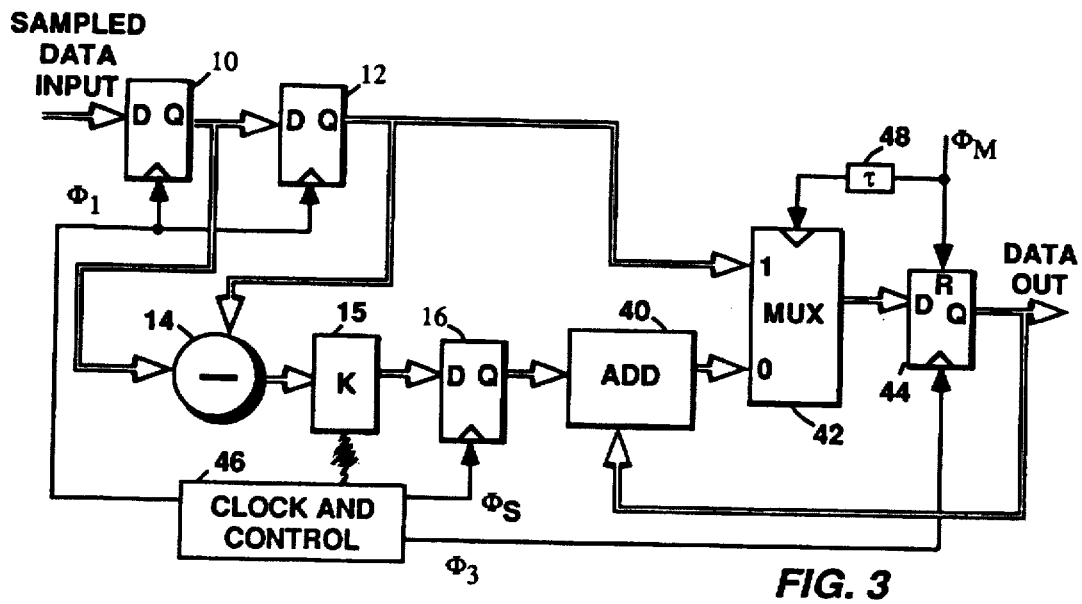
FIG. 3 is a block diagram of an alternative interpolator embodying the invention.
Figure 4:
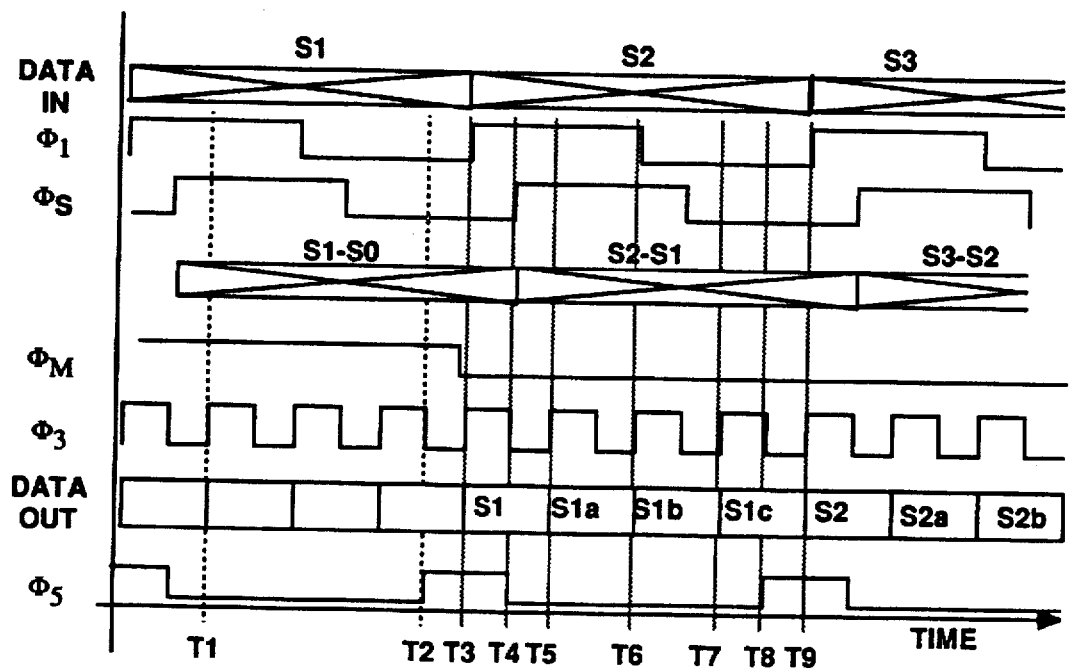
FIG. 4 illustrates clock signal waveforms applied to the FIG. 3 apparatus, which waveforms are useful in describing operation of the invention.

Referring to FIGS. 3 and 4, and alternative configuration of the interpolator will be described. Elements in FIGS. 3 and 4 designated with like numbers as elements in FIGS. 1 and 2 respectively are similar and perform similar functions. As in FIG. 1, the elements 10-16 generate sample differences, but with respective differences latched in the D-Latch 16 responsive to a clock signal Φ$_S$. The output port of the D-Latch 16 is coupled directly to one input port of an adder 40. Adder 40 is configured as an accumulator with its output port coupled back to its second input port via a one sample period delay element consisting in this example of a D-Latch 44 which is clocked by clock signal Φ$_3$. A multiplexer 42 is interposed between the output port of adder 40 and the input port of the delay element 44 for the purpose of resetting the accumulator value. The resetting value is provided from the D-Latch 12 to a second input terminal of the multiplexer 42. A clock signal Φ$_M$ is applied to reset the D-Latch 44, and to control the multiplexer 42. A slight delay is provided in the clock signal between the D-Latch and the multiplexer to enable the D-Latch to load a value provided by the "1" input port of the multiplexer before the multiplexer is conditioned to switch to its "0" input port.

In this example of this embodiment, the clock signal maintains the delay element 44 (D-Latch 44) reset until a particular sample value occurs, in this instance sample S1. When sample S1 is available in the D-Latch 12, clock signal Φ$_M$ goes high immediately before time T3, releasing the reset control of the D-Latch 44. At time T3, sample S1 is latched into D-Latch 44 and provided as the first output sample in the output sequence. Immediately after time T3, the delayed signal Φ$_M$ conditions the multiplexer 42 to couple the output of the adder 40 to the D input port of the D-Latch 44, thereby arranging the adder in the accumulator configuration. The multiplexer may be held in this state indefinitely.

As in the FIG. 1 example, the waveforms of FIG. 4 applied to the FIG. 3 apparatus correspond to a system for interpolating three interstitial samples between each pair of original samples. The weighting factor K is equal to ¼. At time T3, the accumulator is set with the value of sample S1. Thereafter the accumulator, responsive to the clock signal Φ$_3$, successively adds the weighted differences provided by the D-Latch 16 to the previous sum, to provide an output sample sequence having a sample rate four times the input sample rate. For each pair of samples, the difference between the pair is accumulated four times. At the fourth accumulation the second sample of a respective sample pair is produced. Note, for example S1+4(S2-S1)(¼)=S1+S2-S1+S2. Hence there is no need to reset the accumulator for each original sample value, and the adder can operate continuously as an accumulator adding difference values. The difference values will change at the input sample rate, but the weighting factor is maintained constant. The number of samples per input sample is determined between the difference between the input sample rate and the rate of the clock signal $\Phi_3$. If the clock signal $\Phi_3$ is R times the input sample rate, implying an R times sample rate up-conversion, the weighting factor should be 1/R.

It should be appreciated however, that an error generated in the FIG. 3 arrangement may propagate over a large number of samples, which is not the case in the FIG. 1 arrangement where at most an error may only propagate over interstitial sample generated between a pair of original samples. In a further embodiment, the D-Latch 44 and multiplexer 42 of FIG. 3 circuitry may be controlled independently. The multiplexer 42 may be controlled, with a clock pulse similar to the CLOCK signal $\Phi_5$ in FIG. 4, to reset the accumulator with each new sample value. This arrangement reduces the necessary circuitry relative to FIG. 1, and includes the advantages of the FIG. 1 embodiment.

What is claimed is:

1. An interpolator comprising:

a source of input samples;

delay circuitry arranged to concurrently supply two input samples;

a subtractor having first and second input ports coupled to receive said two input samples;

adder circuitry conditioned to add a weighted difference provided by said subtractor to one of said two input samples to produce an interpolated sample, and conditioned to add said weighted difference to said interpolated sample to produce a further interpolated sample, said adder circuitry including;

an adder having first and second input ports and an output port;

a multiplexer having an output port coupled to the first input port of said adder, having a first input port coupled to the output port of said adder, and having a second input port coupled to said delay circuitry; and further circuitry having an output port coupled to said second input port of said adder, and having an input port coupled to said subtractor and conditioned to couple a difference signal or a zero value to said adder.

2. The interpolator set forth in claim 1 wherein said further circuitry comprises a further multiplexer.

3. The interpolator set forth in claim 1 wherein said further circuitry comprises an AND gate.

4. The interpolator set forth in claim 1 wherein said subtractor includes a weighting circuit to produce a fractional value of differences provided by said subtractor.

5. The interpolator set forth in claim 4 further including a latch coupled between said weighting circuit and said further circuitry.

6. The interpolator set forth in claim 1 further including a latch coupled between said subtractor and said added circuitry.

7. The interpolator set forth in claim 1 further including a latch coupled between the output port of said adder and the first input port of said multiplexer.

* * * * *